United States Patent
Watanabe (10) Patent No.: US 6,584,011 B2
(45) Date of Patent: Jun. 24, 2003

(54) MAGNETIC RANDOM ACCESS MEMORY (75) Inventor: Kentaro Watanabe, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 10/113,364

(22) Filed: Mar. 27, 2002

(65) Prior Publication Data

US 2002/0140000 A1 Oct. 3, 2002

(30) Foreign Application Priority Data

Mar. 28, 2001 (JP) ........................................ 2001-093867

(51) Int. Cl.$^7$ ............................................... G11C 11/02
(52) U.S. Cl. ...................................... 365/158; 365/171
(58) Field of Search ................................ 365/158, 171, 365/173

(56) References Cited

U.S. PATENT DOCUMENTS

| | | | | |
|---|---|---|---|---|
| 5,946,227 A | | 8/1999 | Naji ........................... | 365/158 |
| 6,205,073 B1 | | 3/2001 | Naji ........................... | 365/209 |
| 6,421,271 B1 | * | 7/2002 | Gogl et al. ................. | 365/158 |
| 6,504,752 B2 | * | 1/2003 | Ito ............................. | 365/158 |

OTHER PUBLICATIONS

ISSCC 2000 Digent of Technical Papers, , "Nonvolatile RAM based on Magnetic Tunnel Junction Elements", M. Durhlam et al., Feb. 7, 8, and 9, 2000, pp. 130–131.

* cited by examiner

*Primary Examiner*—Tan T. Nguyen
(74) *Attorney, Agent, or Firm*—Gray Cary Ware & Freidenrich LLP

(57) ABSTRACT

A semiconductor integrated circuit device comprises a plurality of magnetic tunneling junction elements, a writing word line which provides an auxiliary magnetic field for writing data to the plurality of magnetic tunneling junction elements, a plurality of bit lines connected to ones of ends of the respective plurality of magnetic tunneling junction elements, and a cell selecting transistor. The cell selecting transistor is commonly connected to other ends of the respective plurality of magnetic tunneling junction elements.

15 Claims, 8 Drawing Sheets

MAGNETIC RANDOM ACCESS MEMORY

CROSS-REFERENCE TO RELATED APPLICATIONS

This application is based upon and claims the benefit of priority from the prior Japanese Patent Application No. 2001-093867, filed Mar. 28, 2001, the entire contents of which are incorporated herein by reference.

BACKGROUND OF THE INVENTION

1. Field of the Invention

The present invention relates to a semiconductor memory, and in particular, to an effective technique applied to a magnetic random access memory.

2. Description of the Related Art

Currently, as one of the next-generation nonvolatile semiconductor memory devices, a magnetic random access memory (MRAM) using a magnetic tunneling junction (MTJ) element is being developed.

The basic structure of a memory cell of the MRAM is a structure generally called a 1Tr/1MTJ structure formed from one cell selecting transistor and one MTJ element which stores data. Reading of data from the memory cell of the 1Tr/1MTJ structure is carried out by sensing the difference between the electric current flowing at an object-of-reading cell and the electric current flowing at a reference cell. (reference publication: ISSCC 2000 DIGEST OF TECHNICAL PAPERS, pp. 130–131, "Nonvolatile RAM Based on Magnetic Tunnel Junction Elements" M Durlam et al., Feb. 7, 8, and 9, 2000.)

Figure 8A:
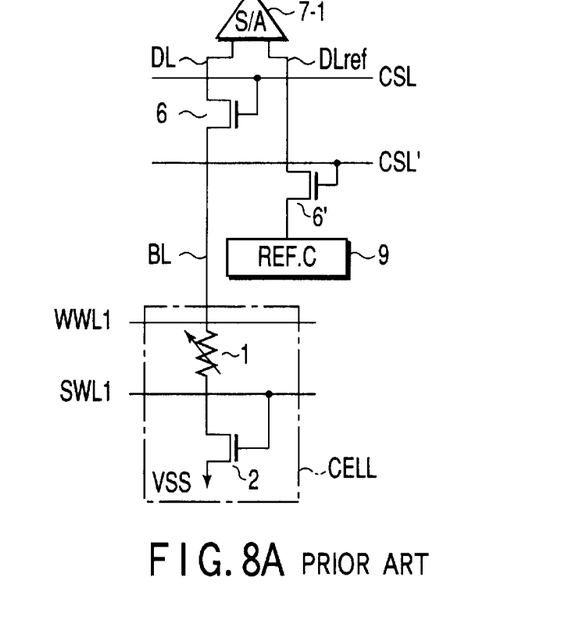
FIG. 8A is a circuit diagram showing a memory cell of an MRAM having a 1Tr/1MTJ structure.

FIG. 8A is a circuit diagram showing a memory cell of an MRAM having the 1Tr/1MTJ structure.

As shown in FIG. 8A, one memory cell is formed from one MTJ element 1, a cell selecting transistor 2 serially-connected to one end of the MTJ element 1, a writing word line WWL (WWL 1 in the figure) which provides an auxiliary magnetic field for writing data to the MTJ element 1, a selecting word line SWL (SWL 1 in the figure) which drives the cell selecting transistor 2, and a bit line BL serially-connected to the other end of the MTJ 1.

The bit line BL is connected to one side of a sense amplifier (S/A) 7 via a data line DL by control of a column gate 6. The gate of the column gate 6 is connected to a column selection signal line CSL. The column gate 6 selects the bit line BL in accordance with the electric potential of the column selection signal line CSL, and connects the selected bit line BL to one input of the sense amplifier 7.

The other input of the sense amplifier 7 is connected to a reference cell (REF. C) 9 via a reference cell data line DLref by control of a column gate 6' for reference cell. The gate of the column gate 6' for reference cell is connected to a column selection signal line CSL' for reference cell. The column gate 6' for reference cell connects the reference cell 9 to the other input of the sense amplifier 7 in accordance with the electric potential of the column selection signal line CSL'.

Figure 9:
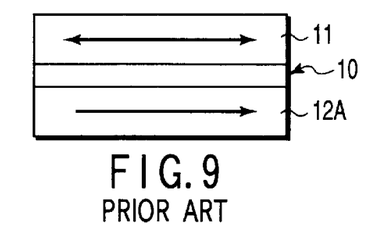
FIG. 9 is a sectional view showing an MTJ element.

FIG. 9 is a sectional view showing a basic structure of the MTJ element 1.

As shown in FIG. 9, the MTJ element 1 has a structure in which an insulating layer 10 is sandwiched between two ferromagnetic layers 11, 12. Data is stored in accordance with whether the directions of magnetization of the two ferromagnetic layers 11, 12 are parallel or anti-parallel. When the directions of magnetization of the two ferromagnetic layers 11, 12 are parallel, in comparison with when the directions of magnetization are anti-parallel, the tunneling probability of the electrons-positive holes flowing at the MTJ element 1 is high. Usually, in an MRAM, a state in which the directions of magnetization of the ferromagnetic layers 11, 12 are parallel and the tunneling probability of the electrons-positive holes is high, i.e., a state in which the electrical resistance ratio is low, is defined as data "1". On the other hand, a state in which the directions of magnetization of the ferromagnetic layers 11, 12 are non-parallel and the tunneling probability of the electrons-positive holes is low, i.e., a state in which the electrical resistance ratio is high, is defined as data "0".

The sense amplifier 7 distinguishes whether the data is "1" or "0" by sensing the difference between the electric current flowing at the object-of-reading cell and the electric current flowing at the reference cell 9. At the time of this reading, the larger the difference between the electric currents, the faster the reading speed, and this is advantageous for making the operation high-speed.

Here, an MRAM having a 2Tr/2MTJ structure, instead of the 1Tr/1MTJ structure, has come to be developed. (reference publication: ISSCC 2000 DIGEST OF TECHNICAL PAPERS, pp. 128–129, "A 10 ns Read and Write Non-Volatile Memory Array Using a Magnetic Tunnel Junction and FET Switch in each Cell" Roy Scheuerlein et al., Feb. 7, 8, and 9, 2000.)

Figure 10A:
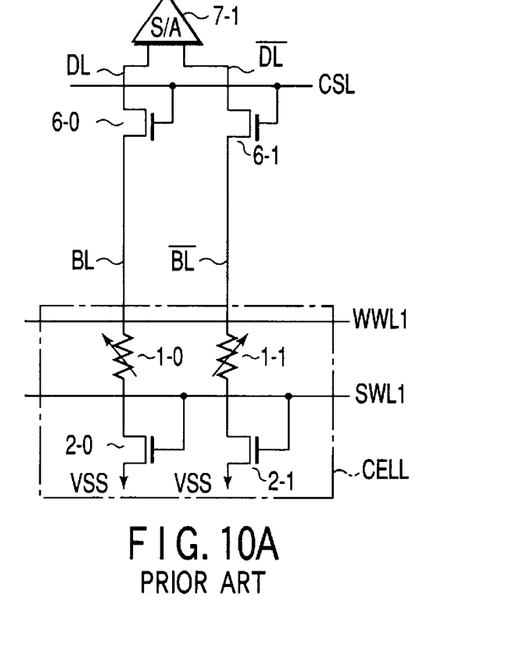
FIG. 10A is a circuit diagram showing a memory cell of an MRAM having a 2Tr/2MTJ structure.

FIG. 10A is a circuit diagram showing a memory cell of an MRAM having the 2Tr/2MTJ structure.

As shown in FIG. 10A, in the 2Tr/2MTJ structure, by making electric current flow to a pair of bit lines BL, /BL in different directions at the time of writing, data are complementarily written such that one of two MTJ elements 1-0, 1-1 is in a state of data "1" and the other is in a state of data "0". At this time, by making electric current flow at the writing word line WWL, a writing auxiliary magnetic field is provided to each of the MTJ elements 1-0, 1-1, and it is possible to write data selectively to only the memory cells which are the intersections of the selected bit lines BL, /BL and the writing word line WWL.

At the time of reading data, two cell selecting transistors 2-0, 2-1 are simultaneously driven, and a difference between electric currents flowing at the bit lines BL, /BL via the two MTJ elements 1-0, 1-1 is sensed by the sense amplifier 7.

In such a 2Tr/2MTJ structure, because data are complementarily written into the two MTJ elements 1-0, 1-1, the difference between the currents can be larger than in the 1Tr/1MTJ structure.

However, the amount of electric current flowing at the bit lines and the data lines via the MTJ elements depends on the channel width of the cell selecting transistor. Hereinafter, the channel width of the cell selecting transistor will be described.

Figure 8B:
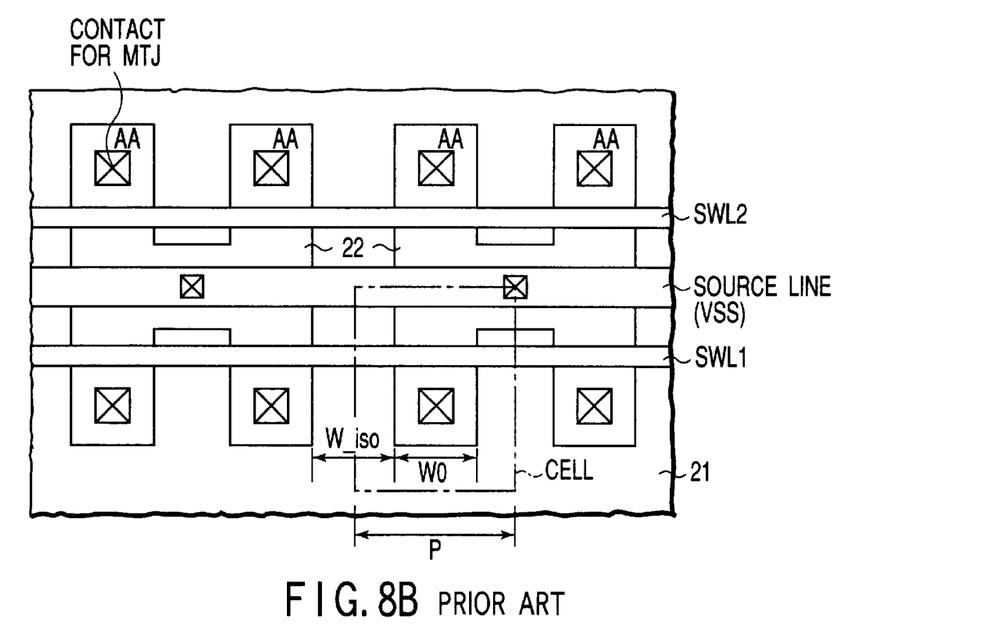
FIG. 8B is a plan view showing a memory cell array at which the memory cells having a 1Tr/1MTJ structure are integrated.

FIG. 8B is a plan view showing a memory cell array in which memory cells having a 1Tr/1MTJ structure are integrated.

As shown in FIG. 8B, an element isolation region 21 is formed on a semiconductor substrate, e.g., a silicon substrate, and active areas (AA) 22 at which a source, a drain, and a channel of the cell selecting transistor 2 are formed are partitioned by the element isolation region 21. The broken lined frame CELL in FIG. 8B shows a region at which one memory cell is disposed, and the cell pitch P per one MTJ element is the sum of an element isolation width W_iso of one element isolation region 21 and a width W0 of one active area 22.

$$P = W_0 + W\_iso$$

Here, because the width $W_0$ of the active area 22 is substantially equal to the channel width of the cell selecting transistor 2 in which the selecting word line SWL is a gate, hereinafter, in this specification, the width $W_0$ is identified as the channel width. Therefore, the channel width $W_0$ of the cell selecting transistor 2 in the 1Tr/1MTJ structure is:

$$W_0 = P - W\_iso$$

Figure 10B:
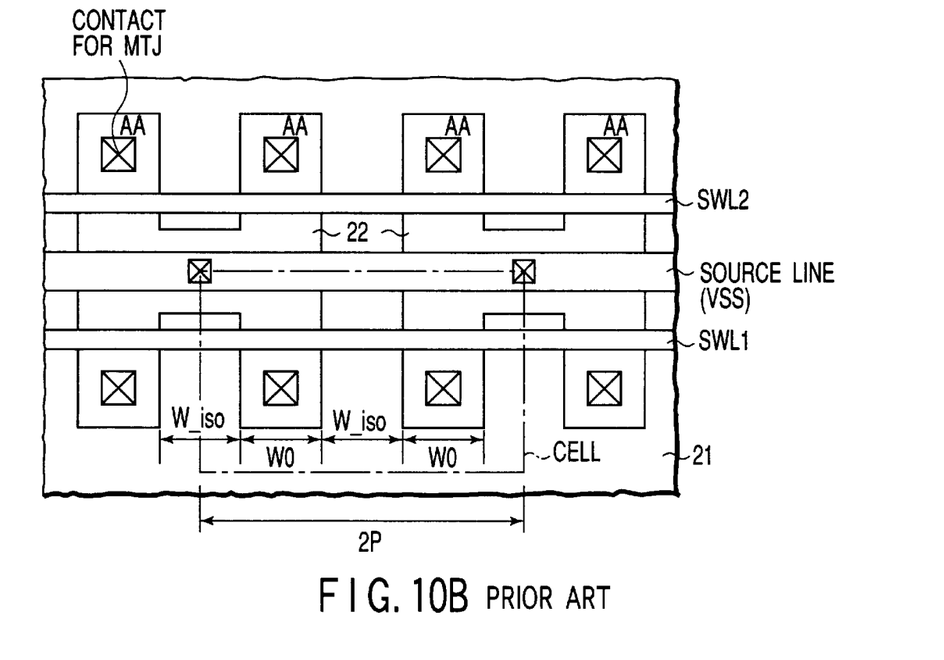
FIG. 10B is a plan view showing a memory cell array at which the memory cells having a 2Tr/2MTJ structure are integrated.

FIG. 10B is a plan view showing a memory cell array in which memory cells having a 2Tr/2MTJ structure are integrated.

As shown in FIG. 10B, a planar pattern of the 2Tr/2MTJ structure follows the planar pattern of the 1Tr/1MTJ structure. Therefore, the channel width $W_0$ per one cell selecting transistor is, in the same way as that of the 1Tr/1MTJ structure:

$$W_0 = P - W\_iso$$

In this way, if the channel width $W_0$ of the cell selecting transistor is limited by reducing a chip area or the like, the electric current flowing at the MTJ element at the time of reading is limited, and therefore, it is disadvantageous for high speed reading.

BRIEF SUMMARY OF THE INVENTION

A semiconductor integrated circuit device according to an aspect of the present invention comprises: a plurality of magnetic tunneling junction elements; a writing word line which applies an auxiliary magnetic field for writing data to the plurality of magnetic tunneling junction elements; a plurality of bit lines connected to ones of ends of the respective plurality of magnetic tunneling junction elements; a cell selecting transistor commonly connected to other ends of the respective plurality of magnetic tunneling junction elements; and a selecting word line which drives the cell selecting transistor.

DETAILED DESCRIPTION OF THE INVENTION

Hereinafter, embodiments of the present invention will be described with reference to the figures. In this description, the common portions are denoted by common reference numerals through all of the figures.

(First Embodiment)

Figure 1A:
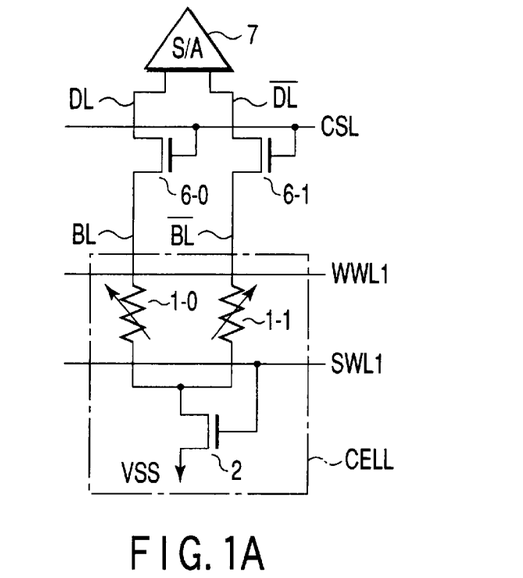
FIG. 1A is a circuit diagram showing a memory cell of an MRAM according to a first embodiment of the present invention.
Figure 1B:
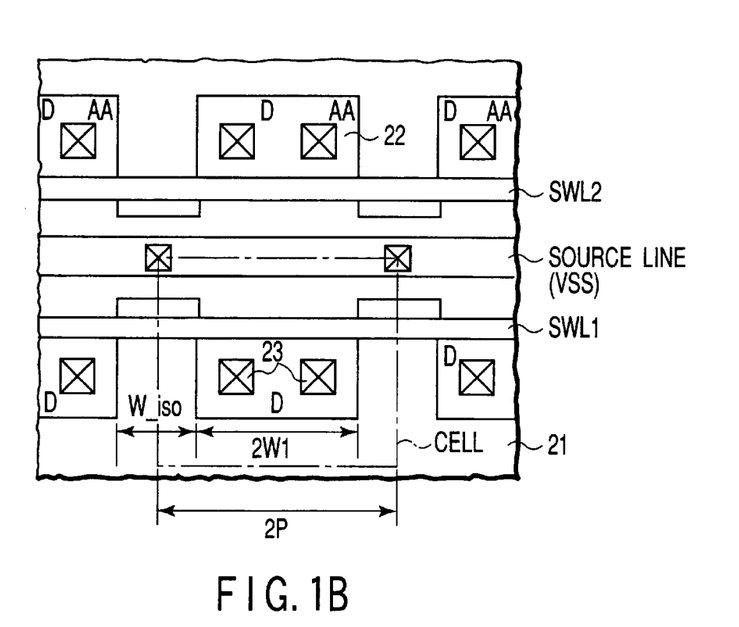
FIG. 1B is a plan view showing a portion of a memory cell array of the MRAM according to the first embodiment of the present invention.

FIG. 1A is a circuit diagram showing a memory cell of an MRAM according to a first embodiment of the present invention, and FIG. 1B is a plan view showing a portion of a memory cell array of the MRAM according to the first embodiment of the present invention.

As shown in FIG. 1A, one memory cell CELL is formed from two MTJ elements 1-0, 1-1, one cell selecting transistor 2 serially-connected commonly to ones of ends of the MTJ elements 1-0, 1-1, a writing word line WWL (WWL 1 in the figure) which provides an auxiliary magnetic field for writing data to the MTJ elements 1-0, 1-1, a selecting word line SWL (SWL 1 in the figure) which drives the cell selecting transistor 2, and a pair of bit lines BL, /BL serially-connected to the other ends of the MTJ elements 1-0, 1-1 respectively.

The pair of bit lines BL, /BL are connected to input of a sense amplifier 7 via a pair of data lines DL, /DL by controls of column gates 6-0, 6-1. The gates of the column gates 6-0, 6-1 are respectively connected to a column selection signal line CSL, and select the pair of bit lines BL, /BL in accordance with the electric potential of the column selection signal line CSL, and connect the selected pair of bit lines BL, /BL to one input of the sense amplifier 7.

Further, as shown in FIG. 1B, the memory cell CELL is integrated by being aligned in an array in element areas (AA) 22 partitioned by an element isolation region 21 formed on a semiconductor substrate, e.g., a silicon substrate. A source, a drain, and a channel of the cell selecting transistor 2 are formed in the element area 22. Two MTJ elements are connected via a contact 23 to one of the drains (D) of the selecting transistor 2 formed in the element region 22.

The first embodiment is, compared with a conventional 1Tr/1MTJ structure and 2Tr/2MTJ structure, a 1Tr/2MTJ structure. The one-dot chain line frame CELL in FIG. 1B shows a region at which one of the memory cells of the 1Tr/2MTJ structure are disposed.

Reading of data is, in the same way as the conventional 2Tr/2MTJ structure MRAM, carried out by sensing by the sense amplifier 7 the difference between the electric current flowing at the bit line BL via the MTJ element 1-0 and the electric current flowing at the bit line /BL via the MTJ element 1-1.

Further, in the same way as the conventional 2Tr/2MTJ structure MRAM, writing of data is the complementary writing of data to the MTJ elements 1-0, 1-1.

Next, effects of the memory cell according to the first embodiment will be described.

In each of the memory cell having the 1Tr/1MTJ structure shown in FIG. 8B and the memory cell having the 2Tr/2MTJ structure shown in FIG. 10B, as described above, the channel width W0 of one cell selection transistor 2 and one element isolation width W_iso are within the region of the cell pitch P.

In contrast thereto, in the first embodiment, as shown in FIG. 1B in particular, a channel width W1 of one cell selection transistor 2 and one element isolation width W_iso may be within the region of cell pitch 2P per two MTJ elements.

Concretely, the channel width W0 of the conventional cell selection transistor 2 per one MTJ element is:

P=W0+W_iso (in the case of the 1Tr/1MTJ structure)
or 2P=2W0+2W_iso (in the case of the 2Tr/2MTJ structure).
Therefore, $$W0=P-W\_iso$$

In contrast thereto, in the first embodiment, the channel width W1 of the cell selection transistor 2 per one MTJ element is:

$$2P=2W1+W\_iso$$

and therefore, $$W1=P-W\_iso/2$$

According to the first embodiment, in comparison with the conventional 1Tr/1MTJ structure and 2Tr/2MTJ structure, the channel width W1 of the cell selection transistor 2 can be enlarged by "(P−W_iso/2)/(P−W_iso)" times, and the electric current at the time of reading can be enlarged by that much. Therefore, an MRAM advantageous for high-speed reading can be obtained.

(Second Embodiment)

In the first embodiment, one cell selection transistor is commonly connected to two MTJ elements.

In contrast thereto, in the second embodiment, one cell selection transistor is commonly connected to 2n MTJ elements. Note that n is a natural number of 1 or more.

Figure 2A:
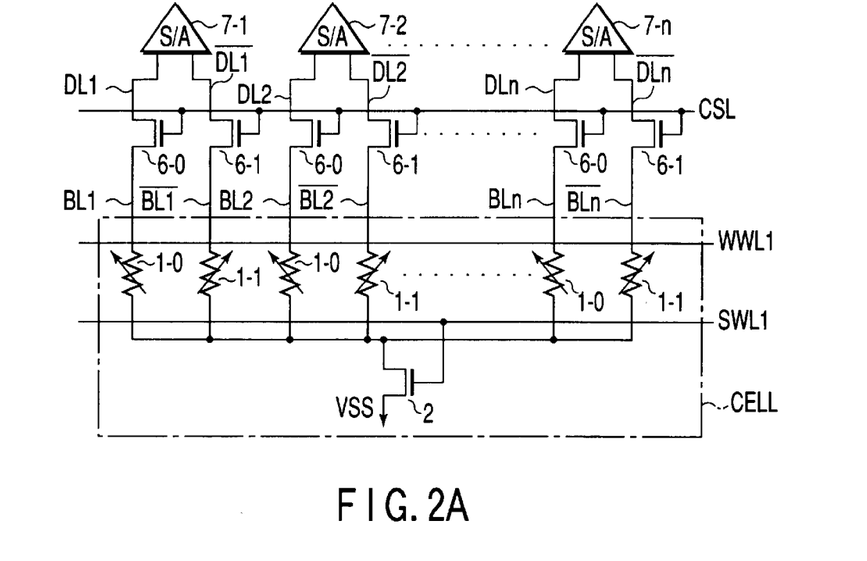
FIG. 2A is a circuit diagram showing a memory cell of an MRAM according to a second embodiment of the present invention.
Figure 2B:
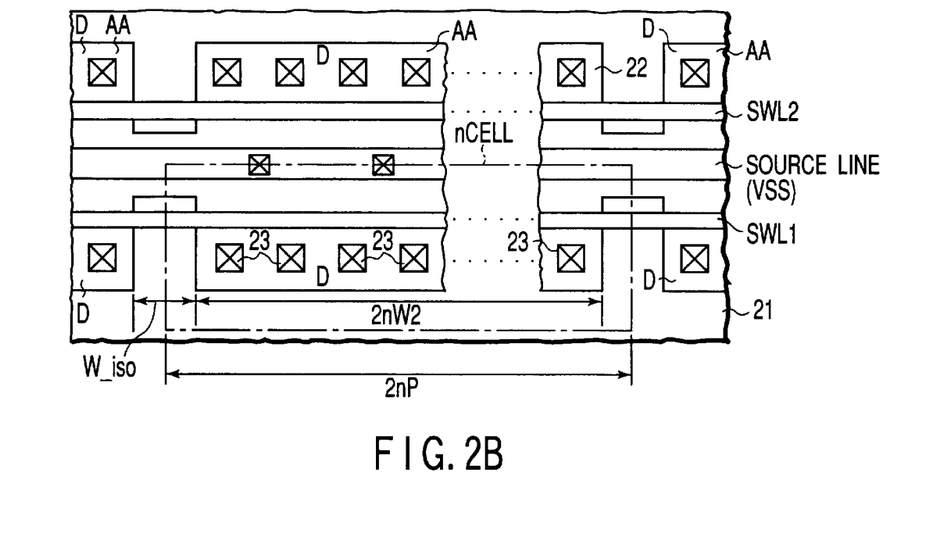
FIG. 2B is a plan view showing a portion of a memory cell array of the MRAM according to the second embodiment of the present invention.

FIG. 2A is a circuit diagram showing a memory cell of an MRAM according to the second embodiment of the present invention, and FIG. 2B is a plan view showing a portion of a memory cell array of the MRAM according to the second embodiment of the present invention.

As shown in FIG. 2A, n memory cells nCELL are formed from 2n MTJ elements 1-0, 1-1, one cell selecting transistor 2 serially-connected commonly to ones of ends of the 2n MTJ elements 1-0, 1-1, the writing word line WWL (WWL 1 in the figure) which provides an auxiliary magnetic field for writing data to the 2n MTJ elements 1-0, 1-1, the selecting word line SWL (SWL 1 in the figure) which drives the cell selecting transistor 2, and n pairs of bit lines BL1 to BLn, /BL1 to /BLn serially-connected to the other ends of the 2n MTJ elements 1-0, 1-1 respectively.

The n pairs of bit lines BL1 to BLn, /BL1 to /BLn are connected to respective inputs of n sense amplifiers 7-1 to 7-n via data lines DL1 to DLn, /DL1 to /DLn by controls of the column gates 6-0, 6-1. The gates of the column gates 6-0, 6-1 are respectively connected to the column selection signal line CSL commonly, and simultaneously select the n pairs of bit lines BL, /BL in accordance with the electric potential of the column selection signal line CSL, and simultaneously connect the selected bit lines BL, /BL to the inputs of the n sense amplifiers 7-0 to 7-n.

Further, as shown in FIG. 2B, the n memory cells nCELL are integrated by being aligned in an array in the element areas (AA) 22 partitioned by the element isolation region 21. The source, the drain, and the channel of the cell selecting transistor 2 are formed in the element area 22, and 2n MTJ elements are connected via the contact 23 to one of the drains (D) of the selecting transistor 2 formed on the element region 22.

The second embodiment is, compared with the conventional 1Tr/1MTJ structure and 2Tr/2MTJ structure, a 1Tr/2nMTJ structure. The one-dot chain line frame CELL in FIG. 2B shows a region at which one of the n-bit memory cells of the 1Tr/2nMTJ structure is disposed.

In the second embodiment, at the time of reading data, the n pairs of bit lines BL1 to BLn, /BL1 to /BLn are simultaneously connected to the n sense amplifiers 7-1 to 7-n via a data line by controls of the column gates 6-0, 6-1, and the n-bit data are simultaneously read.

If the data is read out by such a method, although the electric current which the cell selecting transistor 2 makes flow at the time of reading data is divided into 2n, the capacity charging one of the sense amplifiers 7-1 to 7-n is also divided into 2n.

A channel width W2 of the cell selecting transistor 2 per one MTJ element in the second embodiment is, because 2n MTJ elements are simultaneously driven at the time of reading data:

2nP=2nW2+W_iso
and therefore, $$W2=P-W\_iso/2n$$

According to the second embodiment, in comparison with the conventional 1Tr/1MTJ structure and 2Tr/2MTJ structure, the channel width W2 of the cell selection transistor 2 can be enlarged by "(P−W_iso/2n)/(P−W_iso)" times, and the electric current at the time of reading can be enlarged by the same amount. Therefore, in the same way as in the first embodiment, an MRAM which is advantageous for high-speed reading can be obtained.

(Third Embodiment)

Figure 3A:
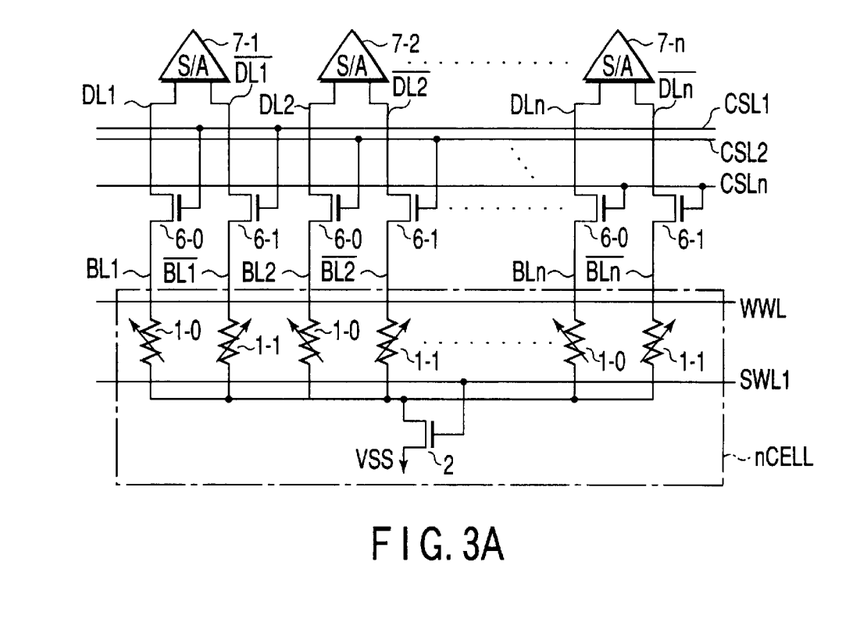
FIG. 3A is a circuit diagram showing a memory cell of an MRAM according to a third embodiment of the present invention.
Figure 3B:
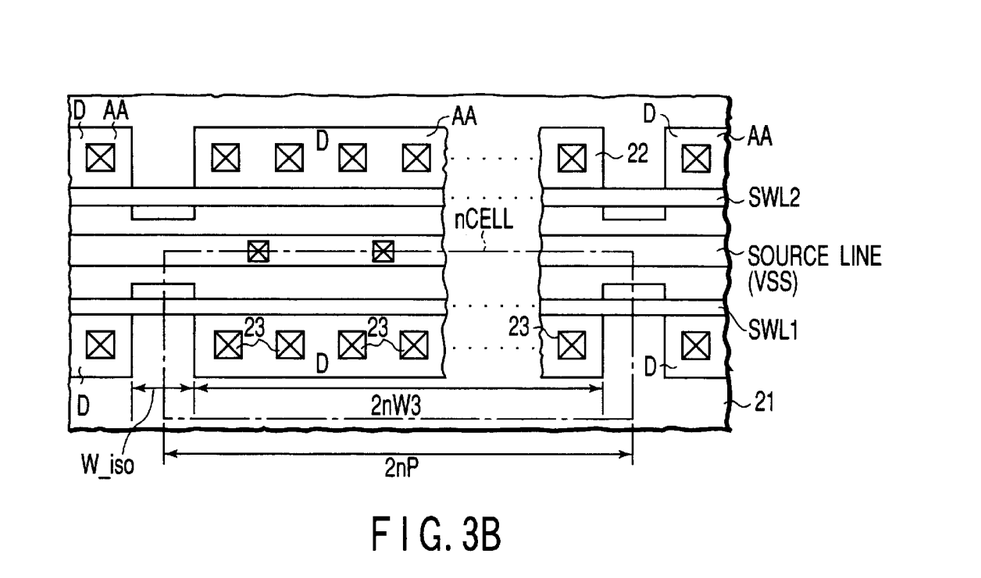
FIG. 3B is a plan view showing a portion of a memory cell array of the MRAM according to the third embodiment of the present invention.

FIG. 3A is a circuit diagram showing a memory cell of an MRAM according to a third embodiment of the present invention, and FIG. 3B is a plan view showing a portion of a memory cell array of the MRAM according to the third embodiment of the present invention.

In the third embodiment, in the same way as in the second embodiment, one cell selection transistor is commonly connected to 2n MTJ elements.

The different point is, as shown in FIGS. 3A and 3B, that one pair among the n pairs of bit lines BL1 to BLn, /BL1 to /BLn is connected to one of the n sense amplifiers 7-0 to 7-n via the data lines DL1 to DLn, /DL1 to /DLn by controls of the column gates 6-0, 6-1 at the time of reading data. Therefore, column selection signal lines CSL1 to CSLn are respectively connected to the gates of the column gates 6-0, 6-1, and can be independently selected one-by-one.

In the third embodiment, only one pair among the n pairs of bit lines BL1 to BLn, /BL1 to /BLn is connected to one of the n sense amplifiers 7-1 to 7-n via the data lines DL1 to DLn, /DL1 to /DLn by controls of one column gate 6-0, 6-1 at the time of reading data.

If the data is read out by such a method, because the electric current which the cell selecting transistor 2 makes flow at the time of reading data is completely spent for reading one cell, a large electric current can be obtained. However, the capacity which has to be charged also is n times.

A channel width W3 of the cell selecting transistor 2 per one MTJ element in the third embodiment is, because two MTJ elements are driven at the time of reading data:

$$2nP = 2W3 + W\_iso$$

and therefore, $$W3 = nP - W\_iso/2$$

According to the third embodiment, in comparison with the conventional 1Tr/1MTJ structure and 2Tr/2MTJ structure, the channel width W3 of the cell selection transistor 2 can be enlarged by "(nP−W_iso/2)/(P−W_iso)" times, and the electric current at the time of reading can be enlarged by the same amount. Therefore, in the same way as in the first and second embodiments, an MRAM which is advantageous for high-speed reading can be obtained.

(Fourth Embodiment)

Figure 4A:
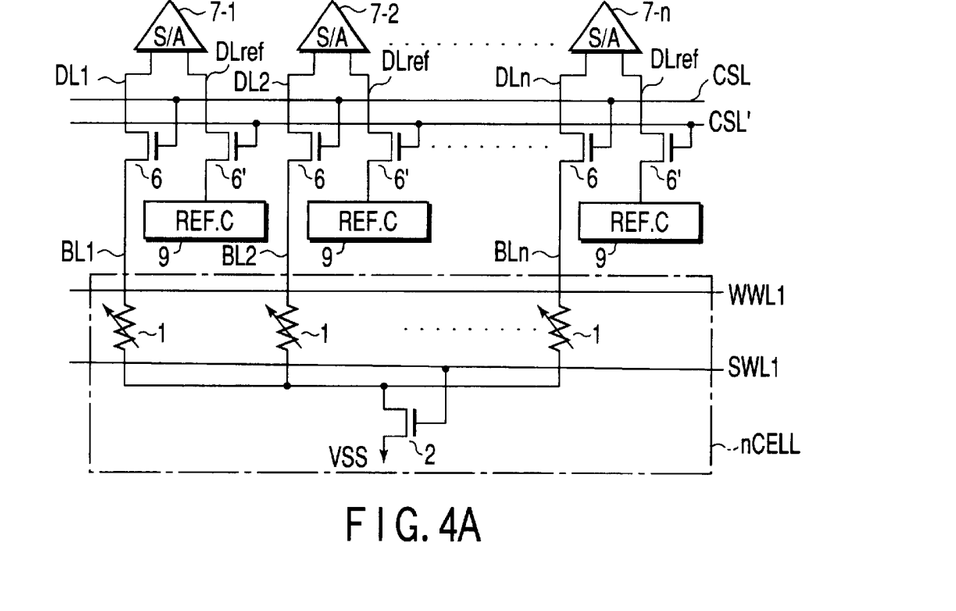
FIG. 4A is a circuit diagram showing a memory cell of an MRAM according to a fourth embodiment of the present invention.

In a fourth embodiment, the MRAM according to the second embodiment is structured so as to read data by sensing the difference between the electric current by which the object-of-reading cell makes flow and the electric current which a reference cell makes flow.

Figure 4B:
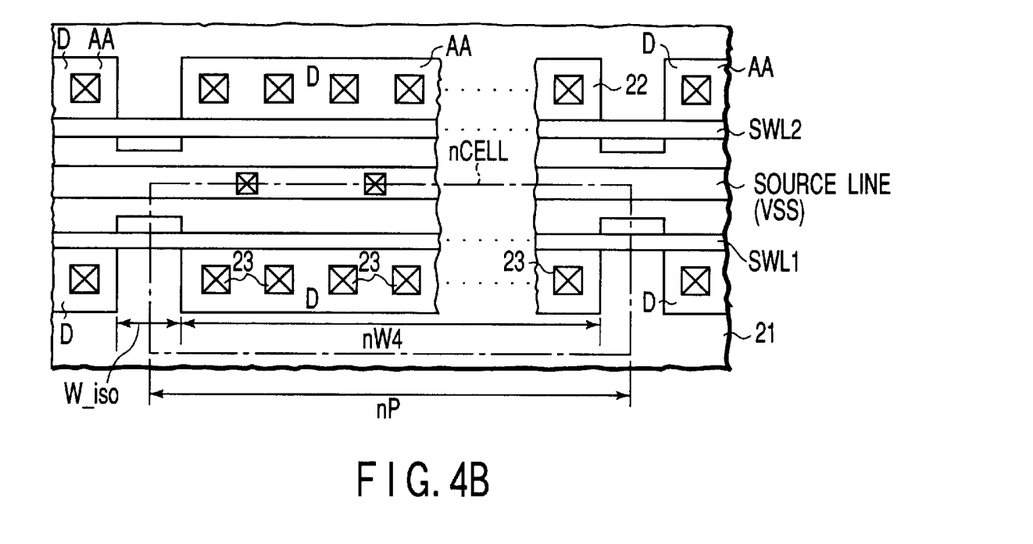
FIG. 4B is a plan view showing a portion of a memory cell array of the MRAM according to the fourth embodiment of the present invention.

FIG. 4A is a circuit diagram showing a memory cell of an MRAM according to the fourth embodiment of the present invention, and FIG. 4B is a plan view showing a portion of a memory cell array of the MRAM according to the fourth embodiment of the present invention.

As shown in FIG. 4A, n memory cells nCELL are formed from n MTJ elements 1, one cell selecting transistor 2 serially-connected commonly to the n MTJ elements 1, the writing word line WWL (WWL 1 in the figure) which provides an auxiliary magnetic field for writing data to the n MTJ elements 1, the selecting word line SWL (SWL 1 in the figure) which drives the cell selecting transistor 2, and n bit lines BL1 to BLn serially-connected to the n MTJ elements 1.

The n bit lines BL1 to BLn are connected to the n sense amplifiers 7-1 to 7-n via the data lines DL1 to DLn by the control of the column gates 6. The gates of the n sets of the column gates 6 are respectively connected to the column selection signal line CSL commonly, and simultaneously select the n bit lines BL1 to BLn in accordance with the electric potential of the column selection signal line CSL, and simultaneously connect the selected bit lines BL1 to BLn to ones of inputs of the n sense amplifiers 7-0 to 7-n.

Reference cells (REF. C) 9 provided separately from the memory cell array are connected to the other inputs of the sense amplifiers 7-0 to 7-n via a data line DLref for reference cell by the control of n sets of column gates 6' for reference cell. The gates of the n sets of column gates 6' for reference cell are respectively connected to the column selection signal line CSL' for reference cell.

Further, as shown in FIG. 4B, the n memory cells nCELL are integrated by being aligned in an array in the element areas (AA) 22 partitioned by the element isolation region 21. The source, the drain, and the channel of the cell selecting transistor 2 are formed in the element area (AA) 22, and n MTJ elements are connected via the contact 23 to one of the drains (D) of the selecting transistor 2 formed on the element region 22.

In the fourth embodiment, at the time of reading data, the n bit lines BL1 to BLn are simultaneously connected to the n sense amplifiers 7-1 to 7-n via data lines by controls of the n sets of column gates 6, and the n-bit data are simultaneously read out.

If the data is read out by such a method, although the electric current which the cell selecting transistor 2 makes flow at the time of reading data is divided into n, the capacity charging one of the sense amplifiers 7-1 to 7-n is also divided into n.

A channel width W4 of the cell selecting transistor 2 per one MTJ element in the fourth embodiment is, because n MTJ elements are simultaneously driven at the time of reading data:

$$nP = nW4 + W\_iso$$

and therefore, $$W4 = P - W\_iso/n$$

According to the fourth embodiment, in comparison with the conventional 1Tr/1MTJ structure and 2Tr/2MTJ structure, the channel width W4 of the cell selection transistor 2 can be enlarged by "(P−W_iso/n)/(P−W_iso)" times, and the electric current at the time of reading can be enlarged by the same amount. Therefore, in the same way as in the first to third embodiments, an MRAM which is advantageous for high-speed reading can be obtained.

(Fifth Embodiment)

Figure 5A:
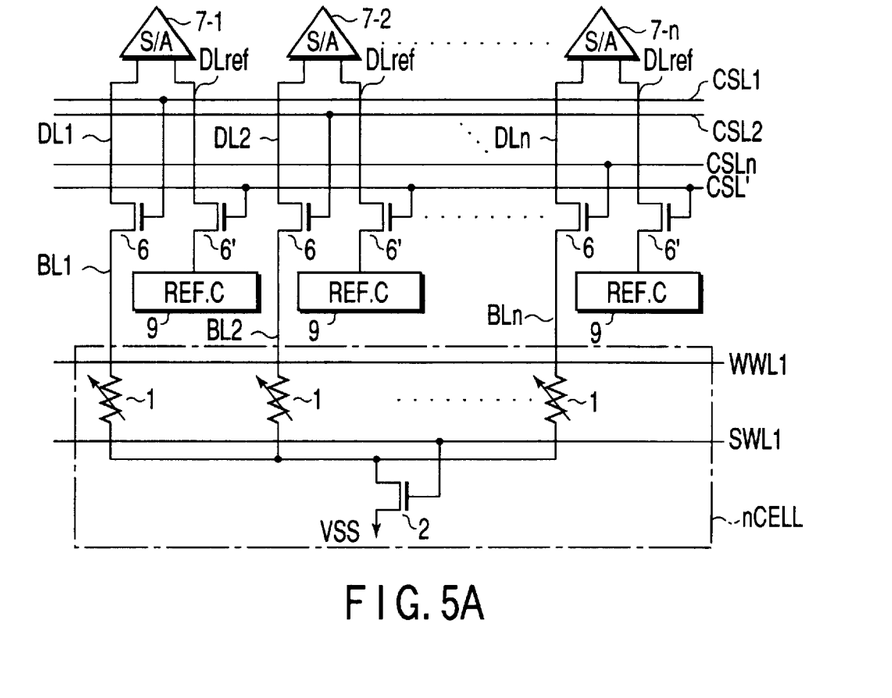
FIG. 5A is a circuit diagram showing a memory cell of an MRAM according to a fifth embodiment of the present invention.
Figure 5B:
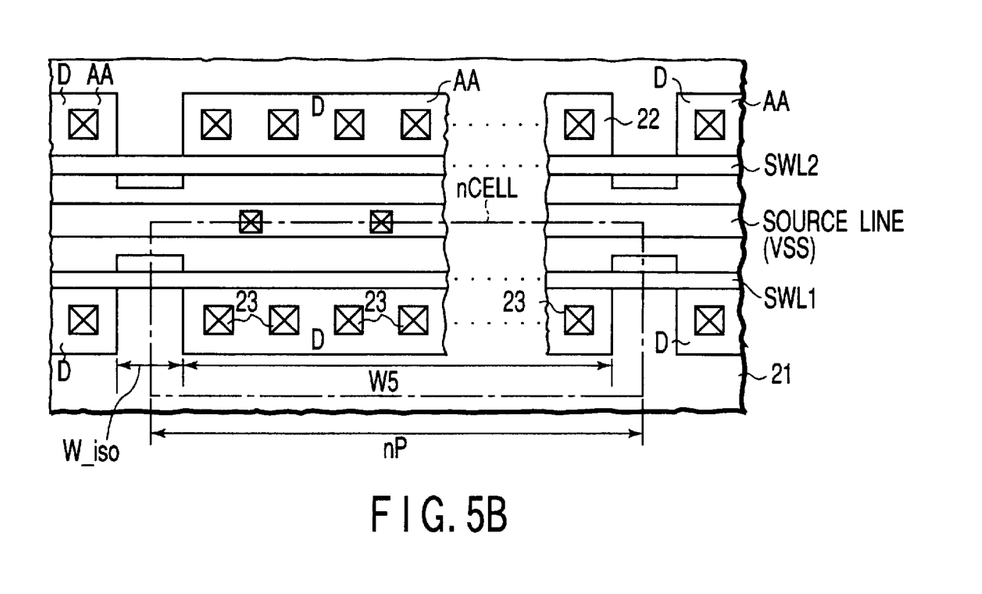
FIG. 5B is a plan view showing a portion of a memory cell array of the MRAM according to the fifth embodiment of the present invention.

FIG. 5A is a circuit diagram showing a memory cell of an MRAM according to a fifth embodiment of the present invention, and FIG. 5B is a plan view showing a portion of a memory cell array of the MRAM according to the fifth embodiment of the present invention.

In the fifth embodiment, in the same way as in the fourth embodiment, one cell selection transistor is commonly connected to n MTJ elements, and data is read by sensing the electric current which the object-of-reading cell makes flow and the electric current which the reference cell makes flow.

The difference is, as shown in FIGS. 5A and 5B, that the point of the fourth embodiment that the n bit lines BL1 to BLn are simultaneously connected to the n sense amplifiers 7-1 to 7-n at the time of reading data is made to be such that one of the n bit lines BL1 to BLn is selected by the column gate 6 and connected to one of the n sense amplifiers 7-1 to 7-n. Therefore, the column selection signal lines CSL1 to CSLn are respectively connected to the gates of the column gates 6, and can be independently selected.

In the fifth embodiment, only one of the n bit lines BL1 to BLn is connected to one of the n sense amplifiers 7-1 to 7-n via the data lines DL1 to DLn by the control of one column gate 6 at the time of reading data.

If the data is read out by such a method, because the electric current which the cell selecting transistor 2 makes flow at the time of reading data is completely spent for reading one cell, a large electric current can be obtained. However, the capacity which has to be charged also is n times.

A channel width W5 of the cell selecting transistor per one MTJ element in the fifth embodiment is, because one MTJ element is driven at the time of reading data:

nP=W5+W_iso and therefore, $$W5=nP-W\_iso$$

According to the fifth embodiment, in comparison with the conventional 1Tr/1MTJ structure and 2Tr/2MTJ structure, the channel width W5 of the cell selection transistor 2 can be enlarged by "(nP−W_iso)/(P−W_iso)" times, and the electric current at the time of reading can be enlarged by the same amount. Therefore, in the same way as in the first to fifth embodiments, an MRAM which is advantageous for high-speed reading can be obtained.

Although the present invention has been described above with reference to the first to fifth embodiments, the present invention is not limited to these respective embodiments, and at the time of executing the invention, various changes are possible within a scope which does not deviate from the gist of the present invention.

Figure 6:
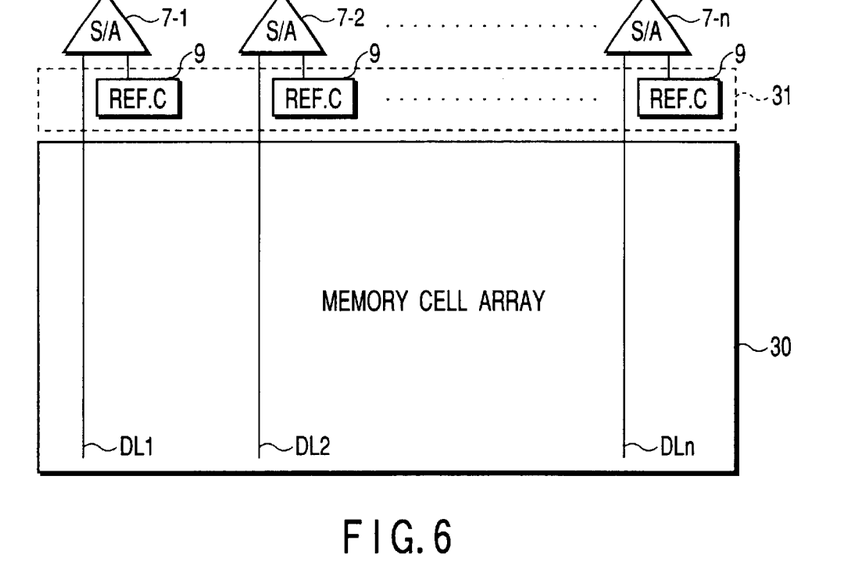
FIG. 6 is a plan view showing a modified example of the present invention.

For example, in the fourth and the fifth embodiments, at the time of reading data, the reference cell 9 is used. As shown in FIG. 6, for example, a reference cell region 31 is formed outside of a memory cell array 30, and the reference cell 9 may be formed here. Of course, the reference cell 9 can be provided in the memory cell array 30.

Figure 7:
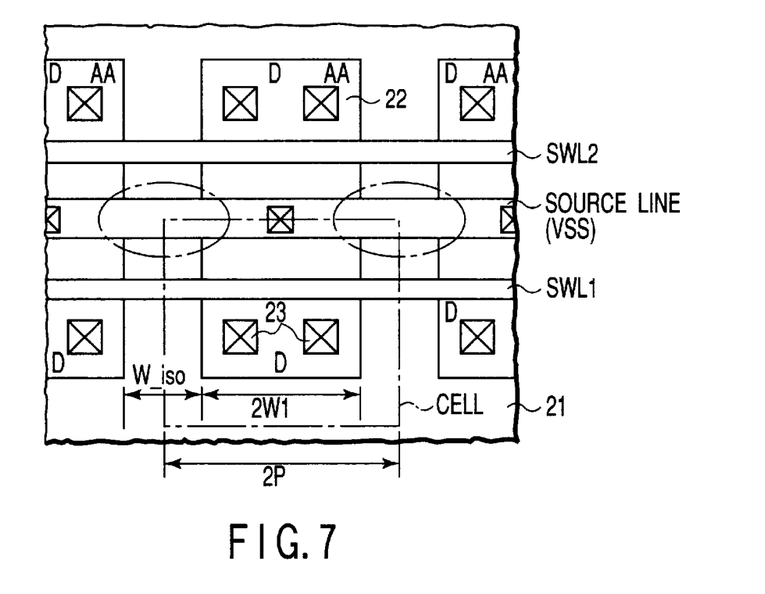
FIG. 7 is a plan view showing another modified example of the present invention.

Further, in the first to fifth embodiments, the patterns of the element areas 22 are patterns in which they are connected to each other along the selecting word line SWL and the source line. However, when a source line is provided, as shown by the one-dot chain line encircled regions of FIG. 7, the element regions 22 may be divided from each other, and may be independent patterns in island-forms.

Further, in the first to fifth embodiments, a column tree structure in which the column gate is one stage is illustrated. However, a column tree structure in which the column gates are in a plurality of stages may be used.

Further, the above-described respective embodiments, of course, may be executed individually or may be executed by being combined appropriately.

Moreover, in the above-described respective embodiments, inventions of various stages are included, and by appropriate combinations of a plurality of structural elements disclosed in the respective embodiments, inventions of various stages can be extracted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
 a plurality of magnetic tunneling junction elements;
 a writing word line which applies an auxiliary magnetic field for writing data to the plurality of magnetic tunneling junction elements;
 a plurality of bit lines connected to ones of ends of the respective plurality of magnetic tunneling junction elements;
 a cell selecting transistor commonly connected to other ends of the respective plurality of magnetic tunneling junction elements; and
 a selecting word line which drives the cell selecting transistor.

2. The device according to claim 1, wherein one memory cell is structured from two of the magnetic tunneling junction elements and the one cell selecting transistor, and
 data are complementarily written into the two magnetic tunneling junction elements respectively.

3. The device according to claim 1, wherein n memory cells are structured from 2×n of the magnetic tunneling junction elements and the one cell selecting transistor, and
 at the time of reading data, n pairs of bit lines are simultaneously connected to n sense amplifiers via a data line by the control of a column gate, and n-bit data are simultaneously read (where n is a natural number of 1 or more).

4. The device according to claim 1, wherein n memory cells are structured from 2×n of the magnetic tunneling junction elements and the one cell selecting transistor, and
 at the time of reading data, one pair of the n pairs of bit lines is connected to one sense amplifier via a data line by the control of a column gate (where n is a natural number of 1 or more).

5. The device according to claim 1, wherein n memory cells are structured from n of the magnetic tunneling junction elements and the one cell selecting transistor, and
 at the time of reading data, n bit lines are simultaneously connected to n sense amplifiers via a data line by the control of a column gate, and n-bit data are simultaneously read (where n is a natural number of 1 or more).

6. The device according to claim 1, wherein n memory cells are structured from n of the magnetic tunneling junction elements and the one cell selecting transistor, and
 at the time of reading data, one bit line of n bit lines is connected to one sense amplifier via a data line by the control of a column gate (where n is a natural number of 1 or more).

7. The device according to claim 1, wherein a channel width W1 of the cell selecting transistor per one magnetic tunneling junction element is:

$$W1=P-W\_iso/2$$

where P is cell pitch/2, and W_iso is an element isolation width.

8. The device according to claim 1, wherein a channel width W2 of the cell selecting transistor per one magnetic tunneling junction element is:

$$W2=P-W\_iso/2n$$

where P is the pitch of one MTJ element, W_iso is an element isolation width, and n is the number of pairs of bit lines.

9. The device according to claim 1, wherein a channel width W3 of the cell selecting transistor per one magnetic tunneling junction element is:

$$W3=nP-W\_iso/2$$

where P is the pitch of one MTJ element, W_iso is an element isolation width, and n is the number of pairs of bit lines.

10. The device according to claim 1, wherein a channel width W4 of the cell selecting transistor per one magnetic tunneling junction element is:

$$W4 = P - W\_iso/n$$

where the pitch of one MTJ element, W_iso is an element isolation width, and n is the number of pairs of bit lines.

11. The device according to claim 1, wherein a channel width W5 of the cell selecting transistor per one magnetic tunneling junction element is:

$$W5 = nP - W\_iso$$

where P is the pitch of one MTJ element, W_iso is an element isolation width, and n is the number of pairs of bit lines.

12. The device according to claim 1, further comprising:
a reference cell which generates electric current which is a reference for determining data at the time of reading data, the reference cell being formed in a reference cell region formed outside of a memory cell array.

13. The device according to claim 1, further comprising:
a reference cell which generates electric current which is a reference for determining data at the time of reading data, the reference cell being formed in a memory cell array.

14. The device according to claim 1, further comprising:
element areas in which the cell selecting transistors are formed, the element areas having a pattern in which the element areas are connected to each other along the selecting word line.

15. The device according to claim 1, further comprising:
a source line provided along the selecting word line, the source line providing a source electric potential to the cell selecting transistor; and
element areas in which the cell selecting transistors are formed, the element areas having a pattern in which the element areas are independent in island-forms.

* * * * *